(12) United States Patent
Kim

(10) Patent No.: US 6,778,040 B2
(45) Date of Patent: Aug. 17, 2004

(54) FEED-THROUGH FILTER HAVING IMPROVED SHIELDING AND MOUNTING FUNCTIONS

(76) Inventor: Sung-Youl Kim, Samsung Mido Apartment 102-201, 737-7, Dang-Dong, Kunpo-City, Kyunggi-Do (KR)

( * ) Notice: Subject to any disclaimer, the term of this patent is extended or adjusted under 35 U.S.C. 154(b) by 0 days.

(21) Appl. No.: 10/197,034

(22) Filed: Jul. 17, 2002

(65) Prior Publication Data

US 2004/0012462 A1 Jan. 22, 2004

(51) Int. Cl.[7] .................................................. H03H 7/00
(52) U.S. Cl. ..................... 333/182; 361/302; 361/306.1
(58) Field of Search ................................ 333/182–185; 361/302, 306.1

(56) References Cited

U.S. PATENT DOCUMENTS

| | | | | |
|---|---|---|---|---|
| 5,650,759 A | * | 7/1997 | Hittman et al. ............. | 333/182 |
| 5,825,608 A | * | 10/1998 | Duva et al. .................. | 361/302 |
| 5,896,267 A | * | 4/1999 | Hittman et al. ............. | 361/302 |
| 5,905,627 A | * | 5/1999 | Brendel et al. ............. | 361/302 |
| 5,959,829 A | * | 9/1999 | Stevenson et al. .......... | 361/302 |
| 5,973,906 A | * | 10/1999 | Stevenson et al. .......... | 361/302 |
| 6,275,369 B1 | * | 8/2001 | Stevenson et al. .......... | 361/302 |
| 6,453,551 B1 | * | 9/2002 | Nordquist et al. ............ | 29/862 |

* cited by examiner

Primary Examiner—Brian Young
Assistant Examiner—John B Nguyen
(74) Attorney, Agent, or Firm—Law Office of Marc D. Machtinger, Ltd.

(57) ABSTRACT

Disclosed herein is a feed-through filter having improved shielding and mounting functions. The feed-through filter of the present invention has an insulating substrate (40), one or more lead terminal through holes (42), lead terminal connection parts (43a), a top surface ground part (41), filter devices (C1 and C2), and a bottom surface ground part (44). The insulating substrate (40) has top, bottom and side surfaces. The lead terminal through holes (42) pass through the top and bottom surfaces of the insulating substrate (40). The lead terminal connection parts (43a) are separately formed around the through holes (42) on the top surface using conductive materials, and electrically connected to lead terminals (L1 and L2). The top surface ground part (41) is formed along the border of the top surface of the insulating substrate (40). The bottom surface ground part (44) is electrically separated from the lead terminals (L1 and L2) by non-conductive regions, which are formed around the lead terminals (L1 and L2) inserted into the lead terminal through holes (42), and is formed on the bottom surface of the insulating substrate (40) using a conductive material.

17 Claims, 17 Drawing Sheets

Top View

Bottom View

α ~ β Cross-sectional View

FIG. 7A
FIG. 7C
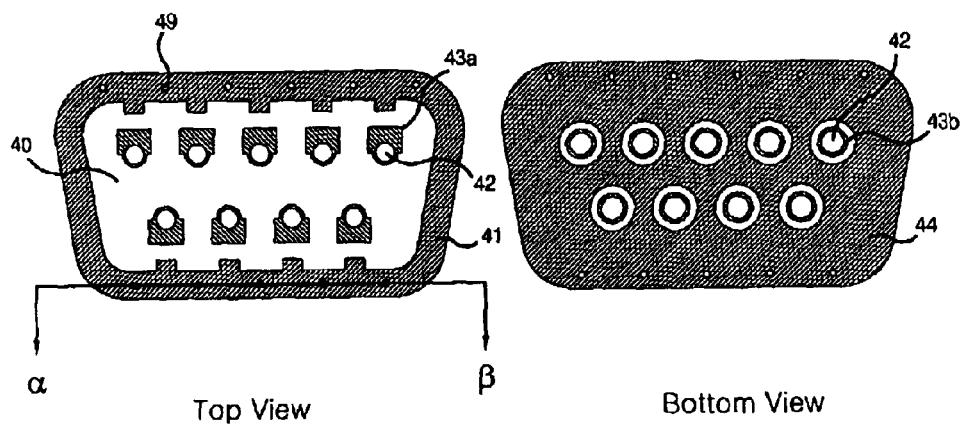
Top View
Bottom View
FIG. 7B
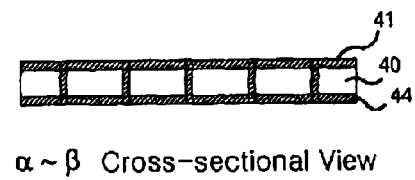
α ~ β Cross-sectional View FIG. 8A
FIG. 8C
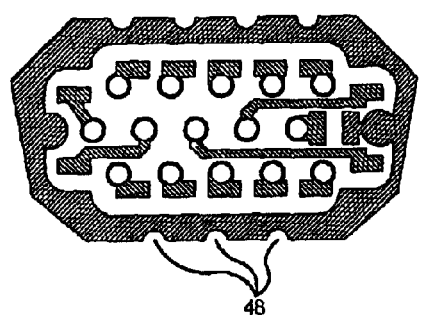
Top View
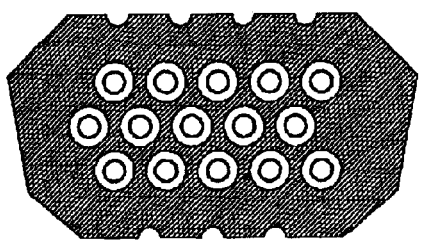
Bottom View
FIG. 8B
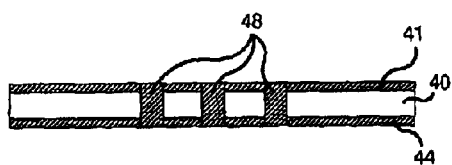
α ~ β Cross-sectional View FIG. 9A
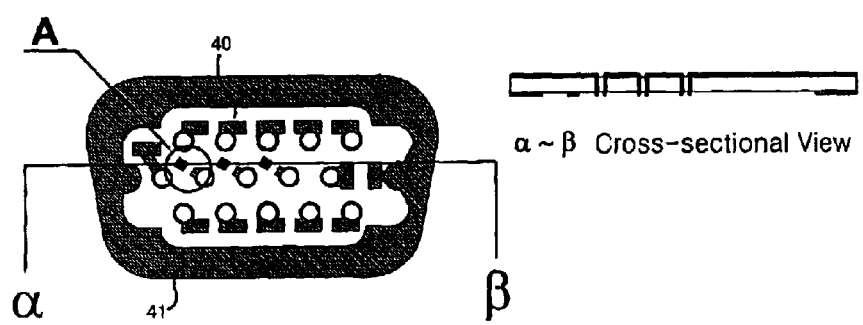
FIG. 9B
α ~ β Cross-sectional View
Top View
FIG. 9C
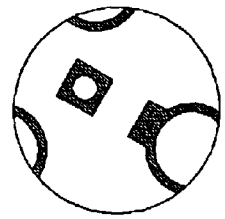
Detailed Drawing Of A
FIG. 9D
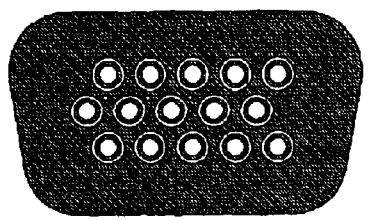
Bottom View FIG. 13A
FIG. 13B
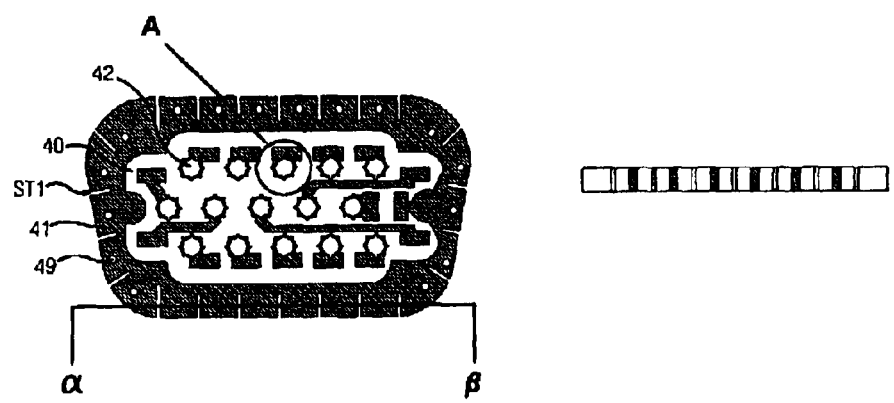
FIG. 13C
FIG. 13D
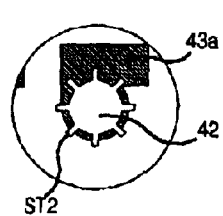
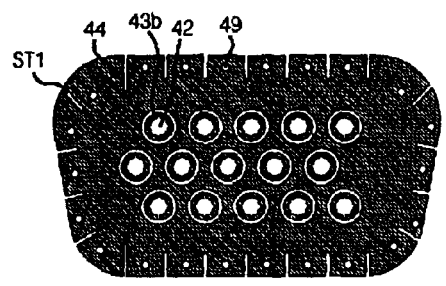

α ~ β Cross-sectional View

FEED-THROUGH FILTER HAVING IMPROVED SHIELDING AND MOUNTING FUNCTIONS

BACKGROUND OF THE INVENTION

1. Field of the Invention

The present invention relates generally to feed-through filters arranged in power lines and signal lines to cut off noise transmitted through those lines, and more particularly to a feed-through filter, which can improve filtering performance by assigning a shielding function to a bottom surface, on which filter devices are not mounted, of the insulating substrate having a plurality of through holes into which lead terminals are respectively inserted and by improving the shielding function, and which can achieve reduction of production cost of a feed-through filter and increase the convenience in use by assigning an elastic adhesion function to the insulating substrate on which filter devices are mounted.

2. Description of the Prior Art

Generally, electromagnetic interference (EMI) is a phenomenon wherein electromagnetic waves directly radiated or conducted from electric/electronic appliances interfere with the reception of electromagnetic waves from other appliances. Alternatively, EMI also is a phenomenon wherein the reception of desired electromagnetic signals is prevented by undesirable electromagnetic signals or electromagnetic noise.

Typically, a feed-through filter is a filter in which external electrodes are grounded and conductors of internal electrodes penetrate through holes, and which cuts off noise occurring on the conductors penetrating the through holes. A feed-through capacitor mounted on the feed-through filter is problematic in that it is expensive and it is difficult to manufacture a capacitor to obtain desired capacitance when the capacitor is realized as a device for a filter. In order to solve the above problems, chip capacitors or plate capacitors, which are inexpensive and are easily mounted on a substrate, must be used. In this case, the feed-through filter can be implemented by arranging a circuit unit on an insulation resin substrate or an insulation ceramic substrate, and then mounting chip capacitors on the substrate using a surface mounting device machine. The feed-through filter implemented according to the above procedure is inserted into a metal housing or a ferrule formed in one of various shapes, thus completing the manufacturing of the feed-through filter.

In the past EMI was mainly treated within a range of electromagnetic wave noise interference. Thereafter, the handling range of EMI is extended to radiated EMI directly radiated from electric/electronic appliances, and conductive EMI conducted along power lines. With the large increase in numbers of various electronic appliances and development of digital technologies and semiconductor technologies, application fields of precision electronic appliances are widened. Therefore, EMI generated from the precision electronic appliances results in mutual malfunctioning of the precision electronic appliances, biological hazard affecting organisms such as the human body, etc., as well as electromagnetic wave noise interference. That is, the influence of electromagnetic energy on biological ecosystems is a serious issue.

Hereinafter, a conventional feed-through filter is described in detail with reference to FIGS. 1 to 3.

FIG. 1 is a perspective view of a conventional feed-through filter. Referring to FIG. 1, a ground part 11 and lead terminal connection parts 12 are formed on an insulating substrate 13 such as an alumina ceramic substrate, on which one or more lead terminal through holes 14 are formed, using a printing method. Chip capacitors 15 are disposed between the ground part 11 and the lead terminal connection parts 12, such that they are mounted on the insulating substrate 13. The construction of such a feed-through filter is disclosed in detail in U.S. Pat. No. 5,959,829.

In the conventional feed-through filter, if the insulating substrate is used as shown in FIG. 1, the lead terminal connection parts 12 and the ground part 11 surrounding the lead terminal connection parts 12 are disposed on the top surface of the insulating substrate, and the chip capacitors 16 are mounted between the lead terminal connection parts 12 and the ground part 11. However, the recent trend toward miniaturization and integration of electronic parts is rapidly spreading. Therefore, provided a filter with a narrow interval between neighboring lead terminals is produced using the conventional method of FIG. 1, it is difficult to dispose the chip capacitor between lead terminals.

FIG. 2A is a perspective view of another conventional feed-through filter and FIG. 2B is a sectional view of a conventional feed-through filter shown in FIG. 2A. Referring to FIGS. 2A and 2B, an insulator 23 through which a lead terminal 24 penetrates is disposed within an outer conductive metal ferrule 22. A chip capacitor is mounted between the lead terminal 23 and the outer conductive metal ferrule 22, and the outer conductive metal ferrule 22 is sealed with insulating resin 21. The construction of such a feed-through filter is disclosed in detail in U.S. Pat. No. 5,650,759.

However, the conventional feed-through filter of FIGS. 2A and 2B is problematic in that a shielding effect is decreased by the provision of plural lead terminals, it is difficult to manufacture the component parts of the filter, and a plurality of capacitors must be mounted by a manual operation.

FIGS. 3A to 3D are views showing the construction of a substrate for a conventional feed-through filter. Referring to FIGS. 3A to 3D, a conventional feed-through filter employs an insulating substrate 30 in which one or more lead terminal through holes 33 are formed. FIG. 3A is a top view of the insulating substrate 30, FIG. 3B is a sectional view of α-β line of FIG. 3A, FIG. 3C is a bottom view of the insulating substrate 30, and FIG. 3D is an equivalent circuit diagram of the feed-through filter.

Referring to FIGS. 3A to 3D, in the conventional feed-through filter, one end electrodes C1b and C2b of chip capacitors C1 and C2 are electrically connected to lead terminal connection parts 32. Further, the other end electrodes C1a and C2a of the chip capacitors C1 and C2 are electrically connected to a top surface ground part 31. Further, a bottom surface ground part 35 is formed along the border of the bottom surface of the insulating substrate 30.

However, in the conventional feed-through filter shown in FIGS. 3A to 3D, a conductive layer is restrictedly formed only at some portion of the bottom surface of the insulating substrate 30, that is, the border of the bottom surface. Therefore, noise cannot be bypassed to the ground through the bottom surface of the insulating substrate 30 of the filter, and passes through the insulating substrate 30, so the filter cannot perform a shielding function.

As described above, in conventional feed-through filters, various methods are proposed so as to use chip capacitors, which are inexpensive and can be easily mounted, in a manufacturing process of filters. However, the conventional filters perform only a filtering function and cannot perform a shielding function through a bottom surface of an insulating substrate. That is, the conventional feed-through filters can hardly provide shielding measures.

Meanwhile, there are proposed methods of improving the shielding effect while assigning a filtering function to a feed-through filter by manufacturing metal structures and insulator structures in various shapes without using an insulating substrate. However, such methods are problematic in that they cause several difficulties, such as increase of costs, etc., due to their complicated manufacturing processes.

SUMMARY OF THE INVENTION

Accordingly, the present invention has been made keeping in mind the above problems occurring in the prior art, and an object of the present invention is to provide a feed-through filter, which can improve filtering performance by assigning a shielding function to a bottom surface, on which filter devices are not mounted, of the insulating substrate having a plurality of through holes into which lead terminals are respectively inserted, and by improving the shielding function.

Another object of the present invention is to provide a feed-through filter, which can intercept the transmission of noise due to unstable mounted states, that is, a gap between a mounting surface of a casing and the feed-through filter can maintain and improve adherence of the filter to the casing by application of conductive silicon in the shape of a band to the top surface of the insulating substrate, which is a mounting surface, or a bottom surface thereof, when the feed-through filter is mounted in the metal casing or metal housing.

A further object of the present invention is to provide a feed-through filter, which can achieve the reduction of production cost and increase the convenience of use, such as ease of mounting, by assigning an elastic adhesion function to an insulating substrate on which filter devices are mounted.

In order to accomplish the above object, the present invention provides a feed-through filter having an improved shielding function, comprising an insulating substrate having top, bottom and side surfaces; one or more lead terminal through holes passing through the top and bottom surfaces of the insulating substrate; one or more lead terminal connection parts separately formed around the through holes on the top surface using conductive materials, and electrically connected to the lead terminals inserted into the through holes to pass therethrough; a top surface ground part formed along the border of the top surface of the insulating substrate in the shape of a band using conductive material, and formed to be spaced apart from the lead terminal connection parts; one or more filter devices each having a first electrode electrically connected to the lead terminal connection parts and a second electrode electrically connected to the top surface ground part; and a bottom surface ground part electrically separated from the lead terminals by non-conductive regions, which are formed around the lead terminals inserted into the lead terminal through holes in shapes of doughnuts, on the bottom surface of the insulating substrate, and made of conductive material.

In the present invention, the bottom surface ground part is formed on the bottom surface of the insulating substrate so as to provide a noise shielding function to the insulating substrate of the feed-through filter, wherein the bottom surface ground part is formed on the bottom surface of the insulating substrate in a specific pattern using a conductive material. For example, the bottom surface ground part can be formed in a mesh pattern using a conductive material. Alternatively, the bottom surface ground part can be formed of a conductive material on the entire bottom surface of the insulating substrate.

Further, the present invention provides a ground connection means for electrically connecting the top and bottom surface ground parts to each other so as to increase the shielding effect of the feed-through filter of the present invention. The ground connection means comprises one or more fine conductive via holes formed to pass through the top and bottom surfaces of the insulating substrate, thus enabling the top surface ground part and the bottom surface ground part to be electrically connected to each other through the conductive via holes. Alternatively, one or more conductive side surface connection parts are formed on side surfaces of the insulating substrate, wherein the top and bottom surface connection parts are electrically connected to each other through the side surface connection parts.

Further, in the present invention, conductive silicon for intercepting the transmission of noise by eliminating gaps between the substrate for a filter and a metal casing is formed on the top and bottom surfaces of the insulating substrate so as to achieve close adhesion of the feed-through filter of the present invention.

Further, in the present invention, an additional conductive shielding substrate can be attached to the bottom surface of the insulating substrate so as to provide a noise shielding function to the insulating substrate of the feed-through filter of the present invention.

Further, in the present invention, a flexible substrate can be used as the insulating substrate of the feed-through filter so as to achieve simple mountability of the feed-through filter, a plurality of through hole slits are formed at predetermined intervals along the internal surface of each of the through holes, and a plurality of substrate slits are formed at predetermined intervals along the border of the insulating substrate.

BRIEF DESCRIPTION OF THE DRAWINGS

The above and other objects, features and other advantages of the present invention will be more clearly understood from the following detailed description taken in conjunction with the accompanying drawings, in which:

FIGS. 6A to 9D are views showing examples of a ground connection means for connecting a top surface ground part with a bottom surface ground part of an insulating substrate of a feed-through filter according to a second preferred embodiment of the present invention.

FIGS. 13A to 13D are views showing a feed-through filter according to a fourth preferred embodiment of the present invention, FIG. 13A being a top view of an insulating substrate of the feed-through filter, FIG. 13B being a sectional view of a α-β line of the insulating substrate of FIG. 10A, FIG. 13C being an enlarged view of a lead terminal through hole of the insulating substrate of FIG. 13A, FIG. 13D being a bottom view of the insulating substrate of FIG. 13A.

DESCRIPTION OF THE PREFERRED EMBODIMENTS

Figure 1:
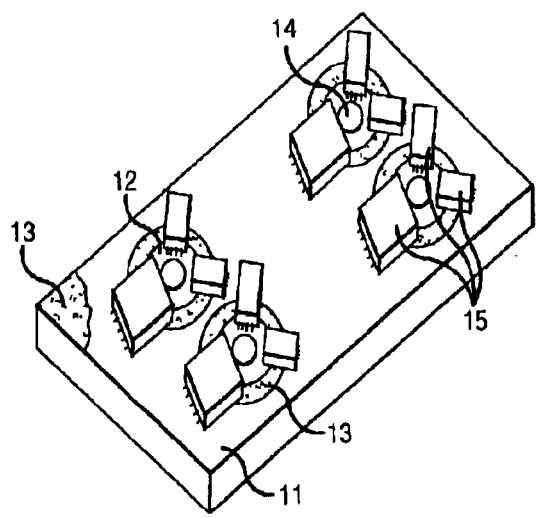
FIG. 1 is a perspective view of a conventional feed-through filter.
Figure 2A:
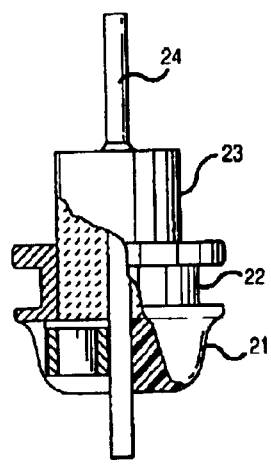
FIG. 2A is a perspective view of another conventional feed-through filter.
Figure 2B:
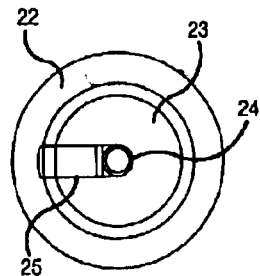
FIG. 2B is a sectional view of a conventional feed-through filter shown in FIG. 2A.
Figure 3A:
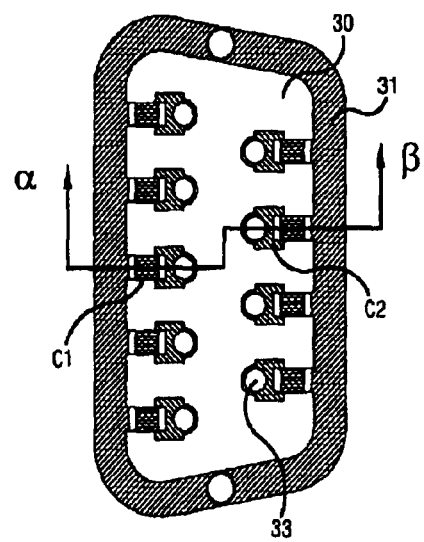
FIGS. 3A to 3D are views showing the construction of a substrate for a conventional feed-through filter.
Figure 3B:
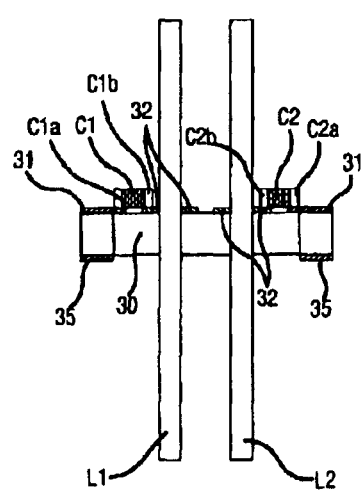
Figure 3C:
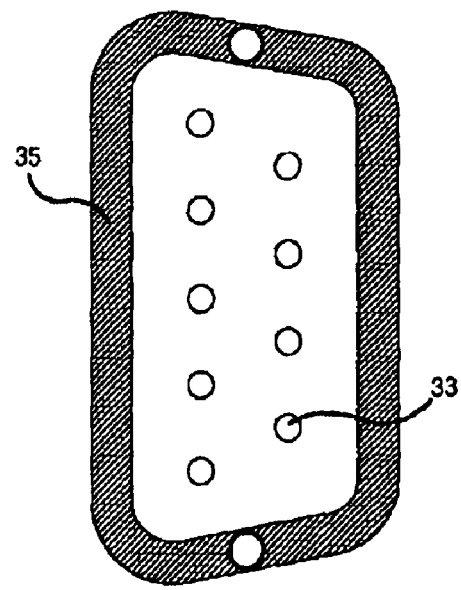
Figure 3D:
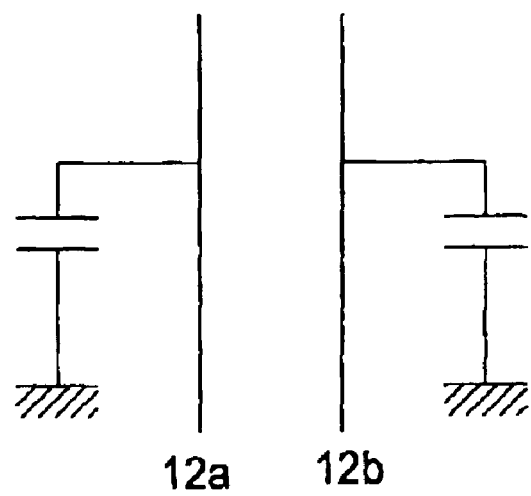

Hereinafter, embodiments of the present invention will be described in detail with reference to the attached drawings.

Reference now should be made to the drawings, in which the same reference numerals are used throughout the different drawings to designate the same or similar components.

Figure 4A:
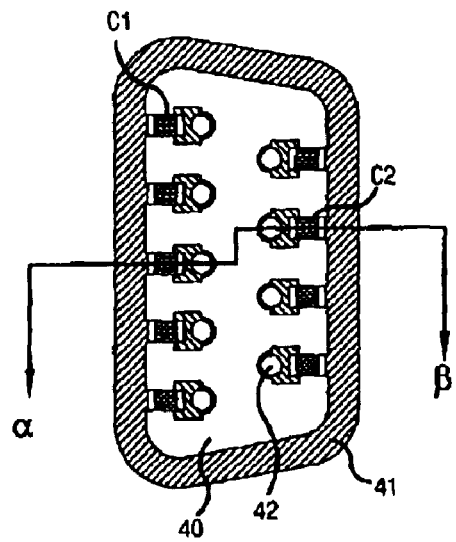
FIGS. 4A to 4D are views showing a feed-through filter according to a first preferred embodiment of the present invention, FIG. 4A being a top view of an insulating substrate of the feed-through filter, FIG. 4B being a sectional view of a α-β line of the insulating substrate of FIG. 4A, FIG. 4C being a view showing a conductive layer formed in a lead terminal through hole of the insulating substrate of FIG. 4A, FIG. 4D being a bottom view of the insulating substrate of FIG. 4A.
Figure 4B:
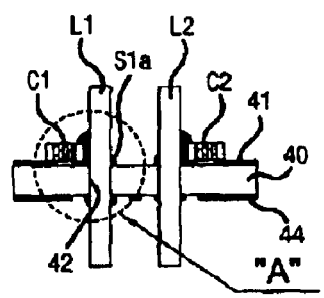
Figure 4C:
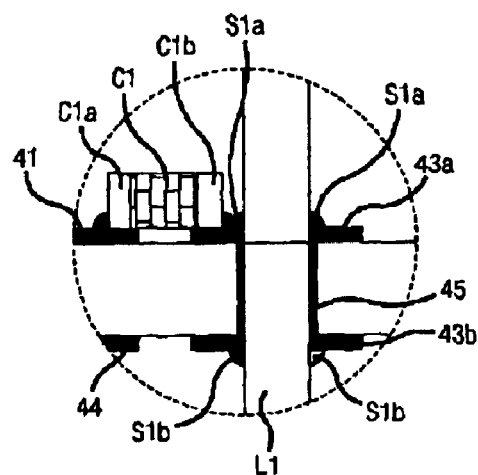
Figure 4D:
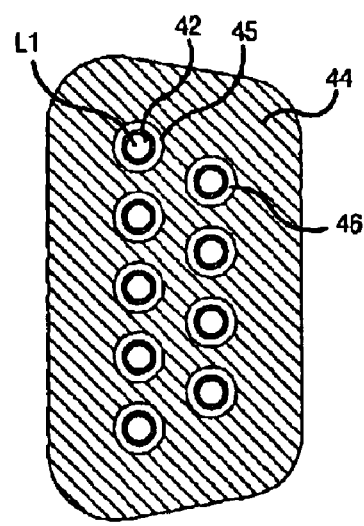

FIGS. 4A to 4D are views showing a feed-through filter according to a first preferred embodiment of the present invention, wherein FIG. 4A is a top view of an insulating substrate of the feed-through filter, FIG. 4B is a sectional view of a α-β line of the insulating substrate of FIG. 4A, FIG. 4C is a view showing a conductive layer formed in a lead terminal through hole of the insulating substrate of FIG. 4A, and FIG. 4D is a bottom view of the insulating substrate of FIG. 4A.

Referring to FIGS. 4A to 4D, the feed-through filter according to a first preferred embodiment of the present invention comprises an insulating substrate 40, one or more lead terminal through holes 42, lead terminal connection parts 43a, a top surface ground part 41, filter devices C1 and C2, and a bottom surface ground part 44. The insulating substrate 40 has top, bottom and side surfaces. The one or more lead terminal through holes 42 pass through the top and bottom surfaces of the insulating substrate 40. The lead terminal connection parts 43a are separately formed around the through holes 42 on the top surface using conductive materials, and electrically connected to lead terminals L1 and L2 inserted into the through holes 42 to pass therethrough. The top surface ground part 41 is formed along the border of the top surface of the insulating substrate 40 in the shape of a band using a conductive material, and formed to be spaced apart from the lead terminal connection parts 43a. The devices C1 and C2 for a filter each have a first electrode electrically connected to the lead terminal connection parts 43a and a second electrode electrically connected to the top surface ground part 41. The bottom surface ground part 44 is electrically separated from the lead terminals L1 and L2 by non-conductive regions, which are formed around the lead terminals L1 and L2 inserted into the lead terminal through holes 42 in shapes of doughnuts, and is formed on the bottom surface of the insulating substrate 40 using a conductive material.

Figure 5A:
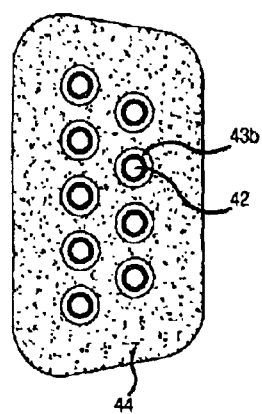
FIGS. 5A to 5C are views showing examples of a bottom surface ground part formed on the bottom surface of the insulating substrate of FIG. 4.
Figure 5B:
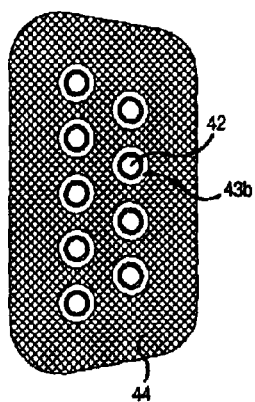
Figure 5C:
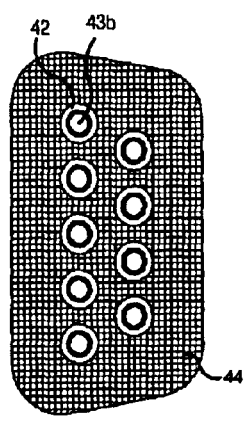
Figure 6A:
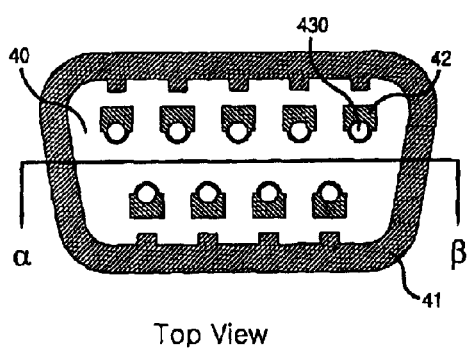
Figure 6C:
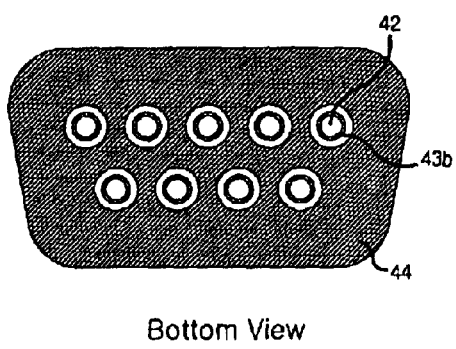
Figure 6B:
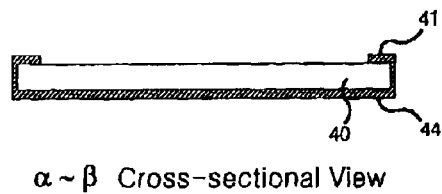

FIGS. 5A to 5C are views showing examples of the bottom surface ground part formed on the bottom surface of the insulating substrate of FIGS. 4A to 4D. Referring to FIGS. 5A to 5C, the bottom surface ground part 44 is formed on the bottom surface of the insulating substrate 40 using a conductive material in the shape of a specific pattern. For example, the bottom surface ground part 44 can be formed in shapes of various mesh patterns, such as a square mesh pattern or a circle mesh pattern, as shown in FIGS. 5B and 5C. Alternatively, the bottom surface ground part 44 can be formed of a conductive material on the entire bottom surface of the insulating substrate 40, as shown in FIG. 5A.

The top and bottom surfaces of the insulating substrate 40 of the present invention are described in detail. That is, the lead terminal connection parts 43a formed on the top surface of the insulating substrate 40 are electrically connected to internal conductive materials (or conductive layers) of the lead terminal through holes 42. Further, the lead terminal connection parts 43a formed on the top surface of the insulating substrate 40 are electrically connected to lead terminal connection parts 43b formed on the bottom surface of the insulating substrate 40. The lead terminal connection parts 43b formed on the bottom surface of the insulating substrate 40 are electrically insulated from the bottom surface ground part 44 by insulating regions formed around the connection parts 43b in shapes of doughnuts. In this case, each insulating region is formed such that its width is as narrow as possible within an allowable range of electrical requirement values such as resisting voltage characteristics of products, thus improving the shielding effect.

Referring to FIG. 4C, conductive material is formed on an internal surface of each of the lead terminal through holes 42. The reason for the formation of a conductive material is to more easily fix the lead terminals L1 and L2 when the lead terminals L1 and L2 are inserted into the lead terminal through holes 42 of the insulating substrate 40 and fixed thereto. In this case, the conductive material is connected to each of the lead terminals L1 and L2 by a soldering process, thus enabling the lead terminals L1 and L2 to be tightly fixed to the insulating substrate 40. As described above, methods of forming conductive materials on the internal surfaces of the lead terminal through holes 42, and connecting the conductive materials to both the lead terminals and the lead terminal connection parts can be variously carried out. In the present invention, the above methods are not limited to specific methods.

FIGS. 6A to 9D are views showing examples of a ground connection means for connecting a top surface ground part with a bottom surface ground part of an insulating substrate of a feed-through filter according to a second preferred embodiment of the present invention. That is, FIGS. 6A to 9D show examples of a substrate construction, in which conductive materials are formed on the side surfaces of the insulating substrate, or in which fine conductive via holes are formed to connect the top surface ground part of the insulating substrate to the bottom surface ground part.

Referring to FIGS. 6A to 9D, the feed-through filter according to the second embodiment of the present invention comprises an insulating substrate 40, one or more lead terminal through holes 42, lead terminal connection parts 43a, a top surface ground part 41, filter devices C1 and C2, a bottom surface ground part 44, and a ground connection means. The insulating substrate 40 has top, bottom and side surfaces. The one or more lead terminal through holes 42 pass through the top and bottom surfaces of the insulating substrate 40. The lead terminal connection parts 43a are separately formed around the through holes 42 on the top surface using conductive materials, and electrically connected to the lead terminals L1 and L2 inserted into the through holes 42 to pass therethrough. The top surface ground part 41 is formed along the border of the top surface of the insulating substrate 40 in the shape of a band using conductive material, and formed to be spaced apart from the lead terminal connection parts 43a. The devices C1 and C2 for a filter each have a first electrode electrically connected to the lead terminal connection parts 43 and a second electrode electrically connected to the top surface ground part 41. The bottom surface ground part 44 is electrically separated from the lead terminals L1 and L2 by non-conductive regions, which are formed around the lead terminals L1 and L2 inserted into the lead terminal through holes 42 in shapes of doughnuts, and formed on the bottom surface of the insulating substrate 40 using a conductive material. The ground connection means electrically connects the top surface ground part 41 with the bottom surface ground part 44.

Especially, FIGS. 8A to 9D show a case where a plurality of lead terminal through holes are densely arranged on the top surface of the insulating substrate 40. In this case, filter devices, such as chip capacitors, cannot be arranged between the lead terminals. Therefore, as shown in FIGS. 8A to 8C, additional pattern lines are formed on the top surface of the insulating substrate 40 so as to allow filter devices to be mounted. In fact, it is difficult to assign a shielding function to the top surface of the insulating substrate 40, on which a plurality of lead terminal through holes 42 are densely arranged. Therefore, in consideration of this difficulty, the bottom surface ground part 44 for electromagnetic shielding is implemented on the bottom surface of the insulating substrate 40, thus assigning the electromagnetic shielding effect to the insulating substrate 40. Further, the fine conductive via holes 49 are formed to be extended from the top surface ground part 41 to the bottom surface ground part 44, thereby enabling the top and bottom surface ground parts 41 and 44 to be electrically connected. Consequently, the shielding effect can be improved by increasing ground area.

As describe above, the present invention can improve shied effect through the increase of ground area by electrically connecting the top surface ground part 41 of the insulating substrate 40 with the bottom surface ground part 44. Such a ground connection means includes fine conductive via holes 49 passing through the top surface and the bottom surface of the insulating substrate 40. In this case, conductive materials are formed within the fine conductive via holes 49 to electrically connect the top surface ground part 41 with the bottom surface ground part 44. The ground connection means further includes one or more side surface connection parts 48 formed in furrow shapes on the side surfaces between the top surface and the bottom surface of the insulating substrate 40. In this case, conductive materials are formed on the side surface connection parts 48 to electrically connect the top surface ground part 41 with the bottom surface ground part 44.

Further, conductive materials are formed in the internal surfaces of the lead terminal through holes 42.

Figure 10A:
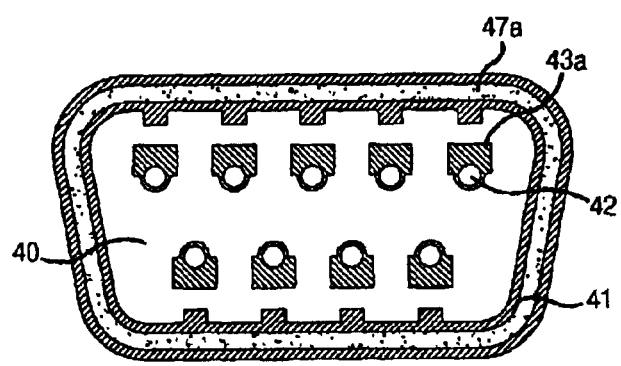
FIGS. 10A and 10B are views showing conductive silicon formed on top and bottom surfaces of an insulating substrate of a feed-through filter according to a third preferred embodiment of the present invention.
Figure 10B:
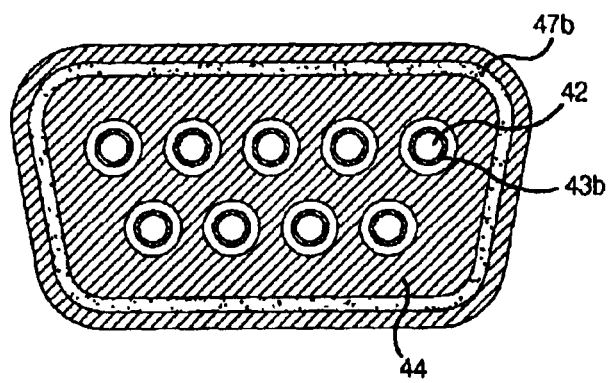

FIGS. 10A and 10B are views showing conductive silicon formed on top and bottom surfaces of an insulating substrate of a feed-through filter according to a third preferred embodiment of the present invention. Referring to FIGS. 10A and 10B, the feed-through filter according to the third preferred embodiment of the present invention comprises an insulating substrate 40, one or more lead terminal through holes 42, lead terminal connection parts 43a, a top surface ground part 41, filter devices C1 and C2, a bottom surface ground part 44, and conductive silicon 47a or 47b. The insulating substrate 40 has top, bottom and side surfaces. The one or more lead terminal through holes 42 pass through the top and bottom surfaces of the insulating substrate 40. The lead terminal connection parts 43a are separately formed around the through holes 42 on the top surface using conductive materials, and electrically connected to the lead terminals L1 and L2 inserted into the through holes 42 to pass therethrough. The top surface ground part 41 is formed along the border of the top surface of the insulating substrate 40 in the shape of a band and extended to side surfaces of the insulating substrate 40 using conductive material, and formed to be spaced apart from the lead terminal connection parts 43a. The devices C1 and C2 for a filter each have a first electrode electrically connected to the lead terminal connection parts 43 and a second electrode electrically connected to the top surface ground part 41. The bottom surface ground part 44 is electrically separated from the lead terminals L1 and L2 by non-conductive regions, which are formed around the lead terminals L1 and L2 inserted into the lead terminal through holes 42 in shapes of doughnuts, and formed on the bottom surface of the insulating substrate 40 using a conductive material. The ground connection means electrically connects the top surface ground part 41 with the bottom surface ground part 44. The conductive silicon 47a or 47b is formed on at least one of the top and bottom surfaces of the insulating substrate 40 in parallel with the border of the insulating substrate 40 in the shape of a band.

In the feed-through filter according to the third preferred embodiment of the present invention, the conductive silicon 47a is applied on the top surface ground part 41 formed on the top surface of the insulating substrate 40 in the shape of a band. Alternatively, the conductive silicon 47b is applied on the bottom surface ground part 44 formed on the bottom surface of the insulating substrate 40 in the shape of a band. Therefore, a gap potentially generated between a mounting surface of a metal casing and the feed-through filter when the feed-through filter of the present invention is mounted in the metal casing can be eliminated, so noise entering through the gap can be cut off, thus realizing an improved shielding effect.

The bottom surface ground part 44 is formed in the shape of a specific pattern on the bottom surface of the insulating substrate 40 using a conductive material. Specifically, the bottom surface ground part 44 is formed in a mesh pattern. Alternatively, the bottom surface ground part 44 can be formed of a conductive material on the entire bottom surface of the insulating substrate 40.

Figure 11A:
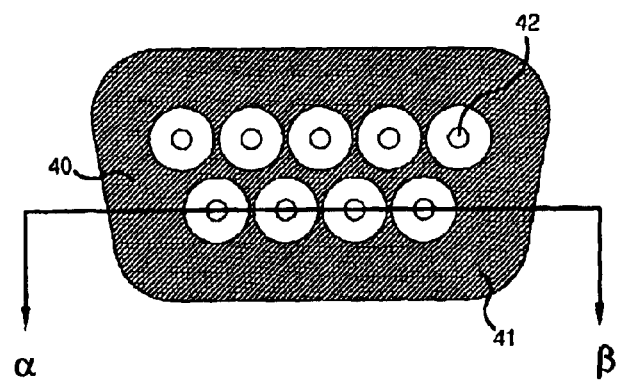
FIGS. 11A to 11C are views showing a feed-through filter according to a fourth preferred embodiment of the present invention, FIG. 11A being a top view of an insulating substrate of the feed-through filter, FIG. 11B being a sectional view of a α-β line of FIG. 11A when a conductive shielding substrate is mounted to the bottom surface of the insulating substrate, FIG. 11C being a top view of the shielding substrate of FIG. 11B.
Figure 11B:
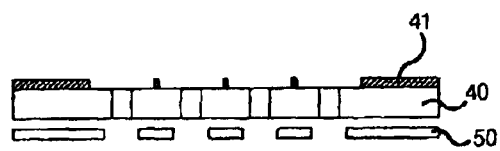
Figure 11C:
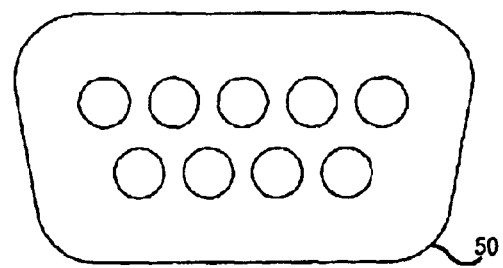

FIGS. 11A to 11C are views showing a feed-through filter according to a fourth preferred embodiment of the present invention, wherein FIG. 11A is a top view of an insulating substrate of the feed-through filter, FIG. 11B is a sectional view of a α-β line of FIG. 11A when a conductive shielding substrate is mounted to the bottom surface of the insulating substrate, and FIG. 11C is a top view of the shielding substrate of FIG. 11B.

Referring to FIGS. 11A to 11C, the feed-through filter according to the fourth preferred embodiment of the present invention comprises an insulating substrate 40, one or more lead terminal through holes 42, lead terminal connection parts 43a, a top surface ground part 41, filter devices C1 and C2, and a conductive shielding substrate 50. The insulating substrate 40 has top, bottom and side surfaces. The one or more lead terminal through holes 42 pass through the top and bottom surfaces of the insulating substrate 40. The lead terminal connection parts 43a are separately formed around the through holes 42 on the top surface using conductive materials, and electrically connected to the lead terminals L1 and L2 inserted into the through holes 42 to pass therethrough. The top surface ground part 41 is formed along the border of the top surface of the insulating substrate 40 in the shape of a band and extended to side surfaces of the insulating substrate 40 using conductive material, and formed to be spaced apart from the lead terminal connection parts 43a. The devices C1 and C2 for a filter each have a first electrode electrically connected to the lead terminal connection parts 43 and a second electrode electrically connected to the top surface ground part 41. The conductive shielding substrate 50 has a surface made of a conductive material and is attached to the bottom surface of the insulating substrate 40.

In the feed-through filter according to the fourth preferred embodiment of the present invention, a bottom surface ground unit is not formed on the bottom surface of the insulating substrate 40 of the feed-through filter, but the conductive shielding substrate 50 is additionally produced and attached to the bottom surface of the insulating substrate 40. The construction of the conductive shielding substrate 50 is illustrated in FIGS. 8B and 8C.

Figure 12:
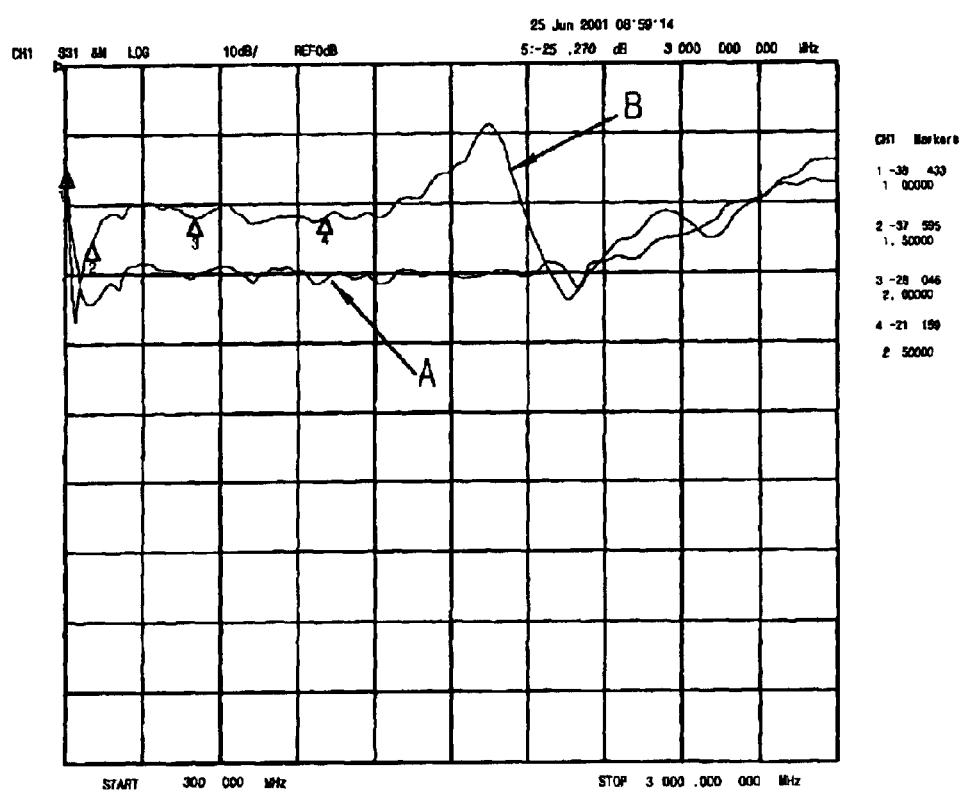
FIG. 12 is a graph showing frequency attenuation characteristics of the feed-through filter of the present invention of FIG. 4 and the conventional feed-through filter of FIG. 3.

FIG. 12 is a graph showing frequency attenuation characteristics of the feed-through filter of the present invention of FIG. 4 and the conventional feed-through filter of FIG. 3. Frequency attenuation characteristics of the feed-through filter of the present invention of FIG. 4 and the conventional feed-through filter of FIG. 3 are clearly seen in FIG. 12. A line A of FIG. 12 represents frequency attenuation characteristics of the feed-through filter employing the insulating substrate of the present invention, while a line B represents those of the conventional feed-through filter. According to FIG. 9, the feed-through filter of the present invention provides excellent attenuation characteristics without causing an undesirable resonance phenomenon.

FIGS. 13A to 13D are views showing a feed-through filter according to a fourth preferred embodiment of the present invention, wherein FIG. 13A is a top view of an insulating substrate of the feed-through filter, FIG. 13B is a sectional view of a α-β line of the insulating substrate of FIG. 13A, FIG. 13C is an enlarged view of a lead terminal through hole of the insulating substrate of FIG. 13A, and FIG. 13D is a bottom view of the insulating substrate of FIG. 13A.

Referring to FIGS. 13A to 13D, the feed-through filter according to the fifth preferred embodiment of the present invention comprises a flexible insulating substrate 40, one or more lead terminal through holes 42, a plurality of through hole slits ST2, lead terminal connection parts 43a, a top surface ground part 41, devices (capacitors) for a filter C1 and C2, and a bottom surface ground part 44. The flexible insulating substrate 40 has top, bottom and side surfaces. The one or more lead terminal through holes 42 pass through the top and bottom surfaces of the insulating substrate 40. The through hole slits ST2 are formed at predetermined intervals along the internal surface of each of the through holes 42. The lead terminal connection parts 43a are separately formed around the through holes 42 on the top surface using conductive materials, and electrically connected to the lead terminals L1 and L2 inserted into the through holes 42 to pass therethrough. The top surface ground part 41 is formed along the border of the top surface of the insulating substrate 40 in the shape of a band and extended to side surfaces of the insulating substrate 40 using conductive material, and formed to be spaced apart from the lead terminal connection parts 43a. The devices C1 and C2 for a filter each have a first electrode electrically connected to the lead terminal connection parts 43 and a second electrode electrically connected to the top surface ground part 41. The bottom surface ground part 44 is electrically separated from the lead terminals L1 and L2 by non-coating regions, which are formed around the lead terminals L1 and L2 inserted into the lead terminal through holes 42 in shapes of doughnuts and formed on the bottom surface of the insulating substrate 40 using a conductive material.

Alternatively, each of the lead terminal connection parts 43a is formed in the same shape as an end portion of the filter devices, that is, an end portion in which the first electrode is formed, so as to allow the filter devices to be easily mounted and to be firmly connected electrically to the lead terminal connection parts 43a. For example, the lead terminal connection parts 43a can be each formed in the shape of a square occupying a predetermined area, as shown in FIGS. 8A–9D, 13A, and 13C.

Further, the feed-through filter according to the fifth preferred embodiment of the present invention further comprises a plurality of substrate slits ST1 formed at predetermined intervals along the border of the insulating substrate 40, and a ground connection means for electrically connecting the top surface ground part 41 with the bottom surface ground part 44.

Figure 15A:
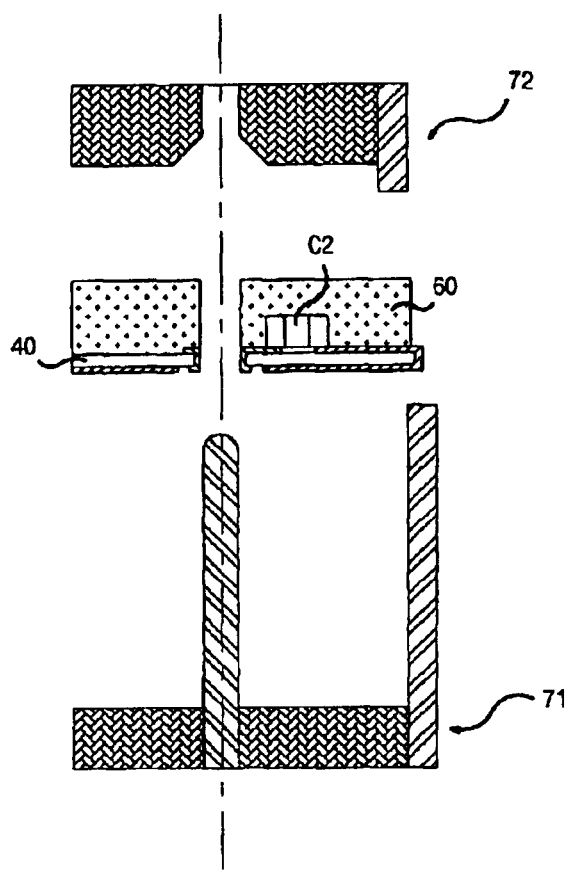
FIGS. 15A and 15B are respectively exploded and assembled views of the feed-through filter of FIGS. 13A to 13D.
Figure 15B:
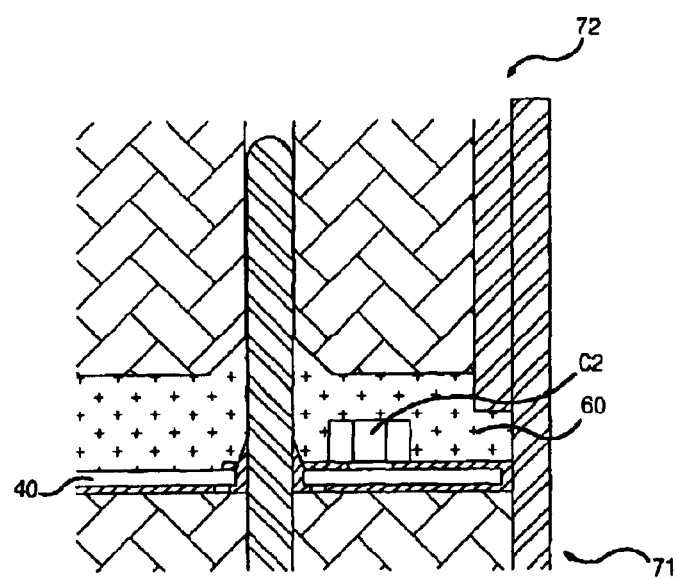

FIGS. 15A and 15B are respectively exploded and assembled views of the feed-through filter. Referring to FIGS. 15A and 15B, if the through hole slits ST2 are formed at the through holes 42 as shown in FIG. 13C, the through holes 42 are formed such that their diameters are slightly smaller than those of the lead terminals inserted thereinto. In this case, when the lead terminals are inserted into the through holes 42, the lead terminals can be tightly fixed to the through holes 42 by elasticity of the flexible insulating substrate 40 in which the through hole slits ST2 are formed as shown in FIG. 15B.

Further, as shown in FIG. 15B, the feed-through filter can be tightly inserted and fixed to female connectors 71 and 72 by elasticity of the flexible insulating substrate 40, in which the substrate slits ST1 are formed, without an additional fixing means, by using the substrate slits ST1 shown in FIGS. 13A and 13D. For this operation, the flexible insulating substrate 40 is formed such that its size is slightly larger than that of a mounting space of the female connectors 71 and 72.

The bottom surface ground part 44 can be formed in a specific pattern using a conductive material on the bottom surface of the insulating substrate 40. Definitely, the bottom surface ground part 44 can be formed in the mesh pattern.

The bottom surface ground part 44 can be formed of a conductive material on the entire bottom surface of the insulating substrate 40.

Figure 14A:
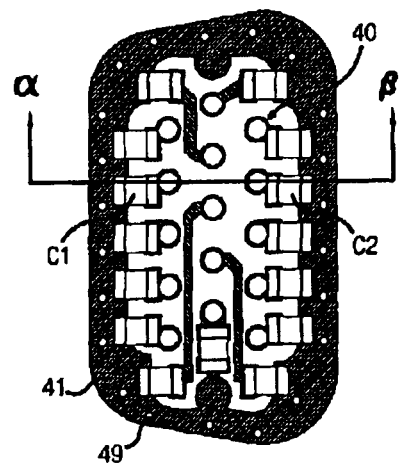
FIGS. 14A to 14C are sectional views of the feed-through filter of FIGS. 13A to 13D on which a buffer is formed.
Figure 14B:
Figure 14C:
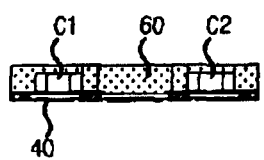

FIGS. 14A to 14C are sectional views of the feed-through filter of FIGS. 13A to 13D on which a buffer is formed.

Referring to FIGS. 14A to 14C, the feed-through filter according to the fifth preferred embodiment of the present invention is designed such that a buffer 60 is formed to cover the filter device on the insulating substrate 40 on which the filter devices C1 and C2 are mounted between the lead terminal connection parts 43a and the top surface ground part 41. In this case, silicon resin can be used as the buffer 60.

In the present invention, when various insulating substrates for a feed-through filter are manufactured, methods of electrically connecting devices to the insulating substrates are not particularly limited to specific methods. For example, soldering, conductive resin, etc. can be preferably used for the methods.

According to the present invention, a chip capacitor mounting circuit for an EMI filtering function is implemented on the top surface of the insulating resin substrate (printed circuit board (PCB), FR4, etc), insulating ceramic substrate or magnetic substrate. Further, a bottom surface ground part for providing the shielding effect is implemented on the bottom surface of the substrate, thus providing the shielding effect to the feed-through filter. Further, the present invention can greatly improve shielding performance by forming fine conductive via holes passing through the top and bottom surfaces of the substrate, or assigning conductivity to side surfaces of the substrate. Further, conductive materials are formed in internal surfaces of the lead terminal through holes of the substrate so as to provide ease of mounting of lead terminals and electrical connection of devices. Further, conductive silicon is applied to the top or bottom surface of the substrate so as to prevent noise from being transmitted through a gap between a mounting surface of a casing and the feed-through filter when the feed-through filter is mounted in a metal casing or a metal housing, thus improving the shielding effect. Further, a surface mounting device machine can be used for mounting capacitors by using the insulating substrate of the present invention, such as an insulating resin substrate (PCB, FR4, etc.), thereby greatly decreasing manufacturing costs of the feed-through filter.

The present invention can be broadly applied to feed-through filters which perform an EMI filtering function, such as multi-layer feed-through filters, in which a plurality of substrates are arranged, as well as feed-through filters employing a single substrate. For example, a plurality of insulating substrates are horizontally arranged on the basis of lead terminal through holes, filter devices are mounted on each substrate, and various kinds of filtering devices are attached and formed between insulating substrates. Therefore, the insulating substrates are formed in a multi-layer structure, thus allowing the insulating substrates to be applied to dual feed-through filters, such as a dual $\pi$-shaped feed-through filter or a dual T-shaped feed-through filter.

As described above, the present invention provides a feed-through filter, which uses chip capacitors or polygon plate capacitors so as to reduce manufacturing cost and improve productivity compared with a conventional feed-through filter employing feed-through capacitors. For providing these advantages, the feed-through filter of the present invention is designed such that a circuit, in which capacitors performing an EMI filtering function are mounted, is implemented on the top surface of an insulating substrate made of insulating resin or insulating ceramic, while a bottom surface ground part for shielding electromagnetic waves is implemented on the bottom surface of the insulating substrate.

Further, the present invention can greatly improve ease of manufacturing of a feed-through filter by using a magnetic substance as a material of a substrate in place of a conventional insulating substrate made of insulating resin or insulating ceramic, etc.

Moreover, in the present invention, one or more holes, into which lead terminals penetrate, are formed on the substrate. Further, on the top surface of the substrate are formed lead terminal connection parts to electrically connect lead terminal through holes, into which the lead terminals are inserted, with lead terminals, and a top surface ground part to bypass electromagnetic waves filtered by capacitors to a ground terminal. Further, there is formed on the bottom surface of the substrate, a bottom surface ground part, in which a conductive material (or conductor) is formed on the entire bottom surface of the substrate such that the entire bottom surface of the substrate becomes a ground part. Moreover, conductors of only some portions around the lead terminals on the bottom surface are eliminated so as to prevent the bottom surface ground part from being shorted to inserted lead terminals, thus maintaining a maximal shielding effect.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A feed-through filter having an improved shielding function, comprising:

an insulating substrate having top, bottom, and side surfaces;

one or more lead terminal through holes passing through from top to bottom surfaces of the insulating substrate;

one or more lead terminal connection parts separately formed around the through holes on the top surface out of conductive materials, and electrically connected to the lead terminals inserted into said through holes to pass therethrough;

a top surface ground part formed along the border of the top surface of the insulating substrate in the shape of a band using conductive material, and formed to be spaced apart from said lead terminal connection parts;

one or more filter devices each having a first electrode electrically connected to said lead terminal connection parts and a second electrode electrically connected to said top surface ground part;

a bottom surface ground part electrically separated from the lead terminals by non-conductive regions, which are formed around the lead terminals inserted into said lead terminal through holes in shapes of doughnuts, on the bottom surface of said insulating substrate, and make of conductive material; and ground connection means for electrically connecting the top surface ground part with the bottom surface ground part.

2. The feed-through filter having improved shielding function according to claim 1 wherein the ground connection means comprises one or more fine conductive via holes formed to pass through from top to bottom surfaces of said insulating substrate, and conductive materials are formed within the fine conductive via holes, which enables the top surface ground part and the bottom surface ground part to be electrically connected to each other.

3. The feed-through filter having improved shielding function according to claim 1, wherein the ground connection means comprises one or more side surface connection parts formed in shapes of furrows on side surfaces between the top surface and the bottom surface of said insulating substrate,
  conductive materials are formed on the side surface connection parts, which enables the top surface ground part and the bottom surface ground part to be electrically connected to each other.

4. The feed-through filter having an improved shielding function according to claim 1, wherein said lead terminal through holes have internal surfaces formed of conductive materials.

5. A feed-through filter having improved shielding function, comprising:
  an insulating substrate having top, bottom and side surfaces;
  one or more lead terminal holes passing through from top to bottom surfaces of said insulating substrate;
  one or more lead terminal connection parts separately formed around the through holes on the top surface out of conductive materials, and electrically connected to the lead terminals inserted into said through holes to pass therethrough;
  a top surface ground art formed along the border of the top surface of the insulating substrate in the shape of a band using conductive material, and formed to be spaced apart from said lead terminal connection parts;
  one or more filter devices each having a first electrode electrically connected to said lead terminal connection parts and a second electrode electrically connected to said top surface ground part;
  a bottom surface ground part electrically separated from the lead terminals by non-conductive regions, which are formed around the lead terminals inserted into said lead terminal through holes in shaped of doughnuts, on the bottom surface of the insulating substrate, and made of conductive material; and
  conductive silicon formed on at least one of the top and bottom surfaces of said insulating substrate in parallel with the border of said insulating substrate in the shape of a band.

6. The feed-through filter having an improved shielding function according to claim 5, wherein said bottom surface ground part is formed of a conductive material on the bottom surface of said insulating substrate in a specific pattern.

7. The feed-through filter having an improved shielding function according to claim 6, wherein said bottom surface ground part is formed of a conductive material on the bottom surface of th insulating substrate in a mesh pattern.

8. The feed-though filter having an improved shielding function according to claim 5, wherein said bottom surface ground part is formed of a conductive material on the entire bottom surface of the insulating substrate.

9. A feed-through filter having an improved shielding function, comprising:
  an insulating substrate having top, bottom and side surfaces;
  one or more lead terminal through holes passing from top to bottom surfaces of said insulating substrate;
  one or more lead terminal connection parts separately formed around the through holes on the top surface out of conductive materials, and electrically connected to the lead terminals inserted into said through holes to pass therethrough;
  a top surface ground part formed along the border of the top surface of the insulating substrate in the shape of band using conductive material, and formed to be spaced apart from said lead terminal connection parts;
  one or more filter devices each having a first electrode electrically connected to said lead terminal connection parts and a second electrode electrically connected to the top surface ground part;
  a conductive shield substrate having a surface made of a conductive material and attached to the bottom surface of said insulating substrate.

10. A feed-through filter having an improved shielding function, comprising:
  a flexible insulating substrate having top, bottom and side surfaces;
  one or more lead terminal through holes passing through from top to bottom surfaces of the flexible insulating substrate;
  a plurality of through hole slits formed at predetermined intervals along the internal surface of each of said through holes;
  one or more lead terminal connection parts separately formed around the through holes on the tops surface out of conductive materials, and electrically connected to the lead terminals inserted into said through holes to pass therethrough;
  a top surface ground part formed along a border of the top surface of said insulating substrate in the shape of band out of conductive material and extended to side surfaces of said insulating substrate, and formed to be spaced apart from said lead terminal connection parts;
  one or more filter devices each having a first electrode electrically connected to the lead terminal connection parts and a second electrode electrically connected to the top surface ground part; and
  a bottom surface ground part electrically separated from the lead terminals by non-coating regions, which are formed around the lead terminals inserted into the lead terminal through holes in shapes of doughnuts, on the bottom surface of the insulating substrate, and made of conductive material.

11. A feed-through filter having an improved shielding function, comprising:
  a flexible insulating substrate having top, bottom and side surfaces;
  one or more lead terminal through holes passing through from top to bottom surfaces of said flexible insulating substrate;
  a plurality of through hole slits formed at predetermined intervals along the internal surface of each of the through holes;
  one or more lead terminal connection parts separately formed around the through holes on the top surface out of conductive materials, and electrically connected to the lead terminals inserted into said through holes to pass therethrough;
  a top surface ground part formed along a border of the top surface of said insulating substrate in the shape of band out of conductive material and extended to said surfaces of said insulating substrate, and formed to be spaced apart from said lead terminal connection parts;
  one or more filter devices each having a first electrode electrically connected to the lead terminal connection parts and a second electrode electrically connected to the top surface ground part;
  a bottom surface ground part electrically separated from the lead terminals by non-coating regions, which are formed around the lead terminals inserted into said lead terminal through holes in shapes of doughnuts, on the bottom surface of said insulating substrate, and made of conductive material; and a plurality of substrate slits formed at predetermined intervals along the border of said insulating substrate.

12. A feed-through filter having an improved shielding function, comprising:

a flexible insulating substrate having top, bottom and side surfaces;

one or more lead terminal through holes passing through from top to bottom surfaces of said flexible insulating substrate;

a plurality of through hole slits formed at predetermined intervals along an internal surface of each of the through holes;

one or more lead terminal connection parts separately formed around the through holes on the top surface using conductive materials, and electrically connected to the lead terminals inserted into said through holes to pass therethrough;

a top surface ground part formed along a border of the top surface of said insulating substrate in the shape of band out of conductive material and extended to side surfaces of said insulating substrate, and formed to be spaced apart from said lead terminal connection parts;

one or more filter devices each having a first electrode electrically connected to the lead terminal connection parts and a second electrode electrically connected to said top surface ground part;

a bottom surface ground part electrically separated from the lead terminals by non-coating regions, which are formed around the lead terminals inserted into said lead terminal through holes in shape of doughnuts, on the bottom surface of said insulating substrate, and made of conductive material;

a plurality of substrate slits formed at predetermined intervals along the border of said insulating substrate; and a ground connection means for electrically connecting said top surface ground part with said bottom surface ground part.

13. The feed-through filter having improved shielding function according to claim 12, wherein the bottom surface ground part is formed of a conductive material on the bottom surface of the insulating substrate in a specific pattern.

14. The feed-through filter having improved shielding function according to claim 13, wherein said bottom surface ground part is formed of a conductive material on said bottom surface of said insulating substrate in a mesh pattern.

15. The feed-through filter having improved shielding function according to claim 12, wherein said bottom surface ground part is formed of a conductive material on the entire bottom surface of said insulating substrate.

16. The feed-through filter having an improved shielding function according to claim 12, further comprising a buffer formed to cover the filter devices on said insulating substrate on which the filter devices are mounted between said lead terminal connection parts and said top surface ground part.

17. The feed-through filter having improved shielding function according to claim 16, wherein the buffer is silicon resin.

* * * * *